United States Patent [19]

Mikata et al.

[11] Patent Number: 5,893,760
[45] Date of Patent: Apr. 13, 1999

[54] METHOD OF HEAT TREATING A SEMICONDUCTOR WAFER TO REDUCE STRESS

[75] Inventors: Yuichi Mikata, Yokohama, Japan; Akihito Yamamoto, Vienna, Va.

[73] Assignee: Kabushiki Kaisha Toshiba, Kawasaki, Japan

[21] Appl. No.: 08/829,700

[22] Filed: Mar. 26, 1997

[30] Foreign Application Priority Data

Mar. 27, 1996 [JP] Japan ............. 8-072184

[51] Int. Cl.[6] ........................ H01L 41/08
[52] U.S. Cl. ............ 438/795; 438/795; 438/796; 438/799; 438/778; 438/758; 438/931
[58] Field of Search ................ 438/795, 796, 438/799, 791, 778, 758, 931

[56] References Cited

U.S. PATENT DOCUMENTS

| | | | |
|---|---|---|---|
| 3,861,969 | 1/1975 | Ono et al. | 148/187 |
| 4,537,244 | 8/1985 | Holden | 165/1 |
| 5,160,998 | 11/1992 | Itoh et al. | 257/760 |
| 5,247,557 | 9/1993 | Ikeda | 378/35 |
| 5,448,096 | 9/1995 | Kohno | 257/402 |
| 5,736,226 | 4/1998 | Tanabe et al. | 428/174 |

FOREIGN PATENT DOCUMENTS

| | | |
|---|---|---|
| 0 669 640 | 8/1995 | European Pat. Off. . |
| 3 439 371 | 5/1985 | Germany . |
| 4 140 387 | 6/1993 | Germany . |

OTHER PUBLICATIONS

Wolf Stanley, Silicon processing for VLSI Era, vol. 1, pp. 114–117, 1990.

*Primary Examiner*—Charles Bowers
*Assistant Examiner*—Thanh Nguyen
*Attorney, Agent, or Firm*—Finnegan, Henderson, Farabow, Garrett & Dunner, L.L.P.

[57] ABSTRACT

A susceptor in a semiconductor wafer heat treatment apparatus holds a wafer such that the wafer is made flat at a heat treatment temperature. In particular, the susceptor is constituted by an elastic platy member which is convex upward with respect to the direction of the gravity. Therefore, when the wafer is subjected to a high-temperature heat treatment, a crystal defect in the wafer can be suppressed.

20 Claims, 5 Drawing Sheets

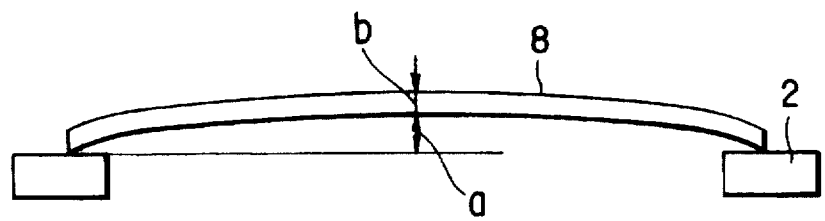
F I G. 4A
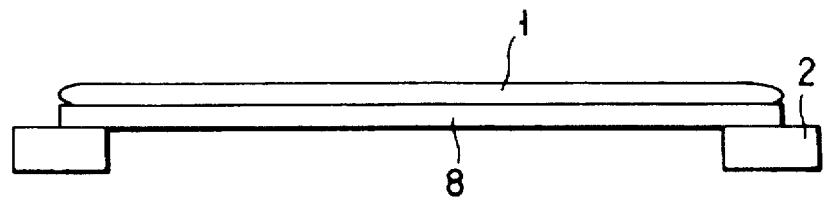
F I G. 4B

METHOD OF HEAT TREATING A SEMICONDUCTOR WAFER TO REDUCE STRESS

BACKGROUND OF THE INVENTION

The present invention relates to a method and an apparatus for semiconductor wafer heat treatment.

Conventionally, in order to form a thin film such as an oxide film on a wafer or diffuse an impurity in a wafer, a heat treatment for heating a wafer is performed. At this time, a semiconductor wafer heat treatment apparatus shown in FIG. 1A is used, for example.

The semiconductor wafer heat treatment apparatus shown in FIG. 1A is called a batch-system hot-wall-type diffusion furnace, and is constituted by a boat (i.e., a jig) 2 for holding a plurality of wafers 1, a chamber 3 constituting a processing chamber for processing the wafers 1 held in the boat 2, and a heater 4 for heating the wafers. In the chamber 3, an inlet 5 for introducing, e.g., a reaction gas into a reaction chamber and an outlet 6 for exhausting the reaction gas from the reaction chamber are arranged.

Each wafer 1 is horizontally held such that the edge portion of the wafer 1 are loaded on convex portions formed in the boat 2. The wafer 1 is, as shown in FIG. 1B for example, held at, e.g., four holding points 7 formed on the edge portion for the following reason. That is, a contact area between the wafer 1 and the boat 2 is minimized to reduce an amount of heat radiation absorbed by the boat 2 and uniformly heat the wafer 1. When the wafer 1 is loaded on the boat 2 or unloaded from the boat 2, the above arrangement is employed to make treatment of the wafer 1 easy. In this manner, a member for horizontally holding the wafer 1 is generally called a susceptor.

However, due to the gravitational load of the wafer 1, stress is generated inside the wafer 1 and at the holding points 7 in the wafer 1. In particular, since the holding points 7 are similar to dots, stress is concentrated on the holding points 7.

Stress σ generated inside the wafer 1 can be calculated on the basis of the following equation:

$$\sigma = (3 \times (3+v) \times q \times r^2)/(8 \times h^2) \quad (1)$$

where v is Poisson's ratio, q is a load per unit area, r is the radius of the wafer, and h is the width (thickness) of the wafer.

FIG. 2 shows the relationship between the stress generated inside the wafer and the diameter of the wafer. As a parameter, the thickness of the wafer is changed. Since the gravitational load of the wafer increases with an increase in diameter of the wafer, the stress increases. When the thickness of the wafer decreases, the stress of that increases.

When a heat treatment at a high temperature is performed in a state where such stress is present inside the wafer, a crystal defect generally called a slip occurs inside the wafer. For example, when the diameter of the wafer is 200 mm, the stress inside the wafer is about $5 \times 10^6$. It is known that a slip occurs due to the gravitational load of the wafer when a heat treatment at about 1,200° C. is performed in the state where the stress is present inside the wafer.

With an increase in diameter of the wafer, as shown in FIG. 2, stress generated inside the wafer increases. In general, as stress increases, a temperature at which the slip occurs decreases.

FIG. 3A shows the relationship between a temperature in which a slip occurs in side a wafer and a diameter of the wafer. Referring to FIG. 3A, in a boundary region, occurrence of a slip is influenced by not only stress but also another factor. For this reason, FIG. 3A shows the temperature region in which a slip occurs varies. As shown in FIG. 3A, the diameter of the wafer increases, stress (see FIG. 3B) generated by the gravitational load increases. For this reason, a critical temperature at which a slip occurs decreases. More specifically, occurrence of a crystal defect caused by stress generated by gravitational load becomes a more remarkable problem in accordance with an increase in diameter of the wafer.

The above problems are summarized as follows.

In a conventional method and apparatus for semiconductor wafer heat treatment, stress is generated inside the wafer by the gravitational load of the wafer. When a heat treatment is performed in the presence of the stress, a crystal defect disadvantageously occurs. Since the gravitational load of the wafer increases with an increase in diameter of the wafer, a crystal defect disadvantageously occurs in a heat treatment at a lower temperature.

BRIEF SUMMARY OF THE INVENTION

Accordingly, it is an object of the present invention to provide a method and an apparatus for semiconductor wafer heat treatment which can suppress a crystal defect from occurring in a wafer when the wafer is horizontally held to be subjected to a heat treatment.

According to one aspect of the present invention, there is provided an apparatus for semiconductor wafer heat treatment, comprising a susceptor for holding a wafer such that the wafer is made flat at a heat treatment temperature; a jig for supporting the susceptor; and a heater for heating the wafer held by the susceptor.

In this apparatus, the susceptor may include means for preventing deformation caused by a gravitational load of the wafer. The susceptor may include means for suppressing stress to be generated inside the wafer. The susceptor may support the wafer at a plurality of portions including a central portion of the wafer. The susceptor may be constituted by an elastic platy member which is convex upward with respect to the direction of the gravity. In this case, the susceptor may have a level difference in height between its peripheral portion and central portion, which has been determined in accordance with rigidity, thickness, and diameter of the susceptor. The susceptor may be constituted by a material having rigidity higher than that of the wafer. A thickness distribution of the susceptor may be not uniform. The susceptor may have a void portion. The susceptor may have a first portion forming an outer peripheral portion of the susceptor, and a second portion arranged inside the first portion and constituted by a material having a thermal expansivity larger than that of the first portion. Both of the susceptor and jig may be unified into one member. The susceptor may be loaded on part of the jig.

According to another aspect of the present invention, there is provided a method of semiconductor wafer heat treatment, comprising the steps of forming, on one surface of a wafer, a platy member for generating tensile stress between the platy member and wafer; holding the platy member such that the tensile stress is effected downward with respect to the direction of the gravity and the wafer is made flat at a heat treatment temperature; and performing a heat treatment for the wafer.

This method may further comprise the step of setting a thickness of the platy member such that the stress generated in the wafer by formation of the platy member is equal to the stress generated by gravitational load of the wafer.

3

According to still another aspect of the present invention, there is provided a method of semiconductor wafer heat treatment, comprising the steps of forming, on one surface of a wafer, a platy member for generating compressive stress between the platy member and wafer; holding the platy member such that the compressive stress is effected upward with respect to the direction of the gravity and the wafer is made flat at a heat treatment temperature; and performing a heat treatment for the wafer.

This method may further comprise the step of setting a thickness of the platy member such that the stress generated in the wafer by formation of the platy member is equal to the stress generated by gravitational load of the wafer.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIGS. 4A and 4B are side views showing the structures of platy members of a semiconductor wafer heat treatment apparatus according to the first embodiment of the present invention;

DETAILED DESCRIPTION OF THE INVENTION

Embodiments of the present invention will be described below with reference to the accompanying drawings.

4

FIGS. 4A and 4B show only portions for holding a wafer 1 in a semiconductor wafer heat treatment apparatus according to the first embodiment of the present invention. For example, as the other portions such as a chamber or a heater constituting the semiconductor wafer heat treatment apparatus, the structure shown in FIG. 1A can be used. FIG. 4A shows a state where the wafer 1 is not loaded, and FIG. 4B shows a state where the wafer 1 is loaded.

As shown in FIG. 4A, the semiconductor wafer heat treatment apparatus according to this embodiment comprises a platy member 8 as a susceptor loaded on part of a boat (i.e., a jig) 2, and is characterized in that the platy member 8 is warped to be convex upward. As shown in FIG. 4B, when the wafer 1 is loaded on the platy member 8, the platy member 8 becomes flat by pressure generated by the weight of the wafer 1 loaded on the platy member 8. A warpage amount a of the platy member 8 is adjusted as follows such that the wafer 1 is horizontal.

A warpage W caused by the gravitational load of the wafer 1 is dependent on the diameter and the thickness of the wafer 1, and is calculated by using the following equation:

$$\sigma = (3\times)(5+v)\times q \times r^4)/(16\times)(E/(1-v))\times h^3) \tag{2}$$

where v is Poisson's ratio, q is a load per unit area, r is the radius of the wafer, h is the width (thickness) of the wafer, and E is Young's modulus.

Figure 5:
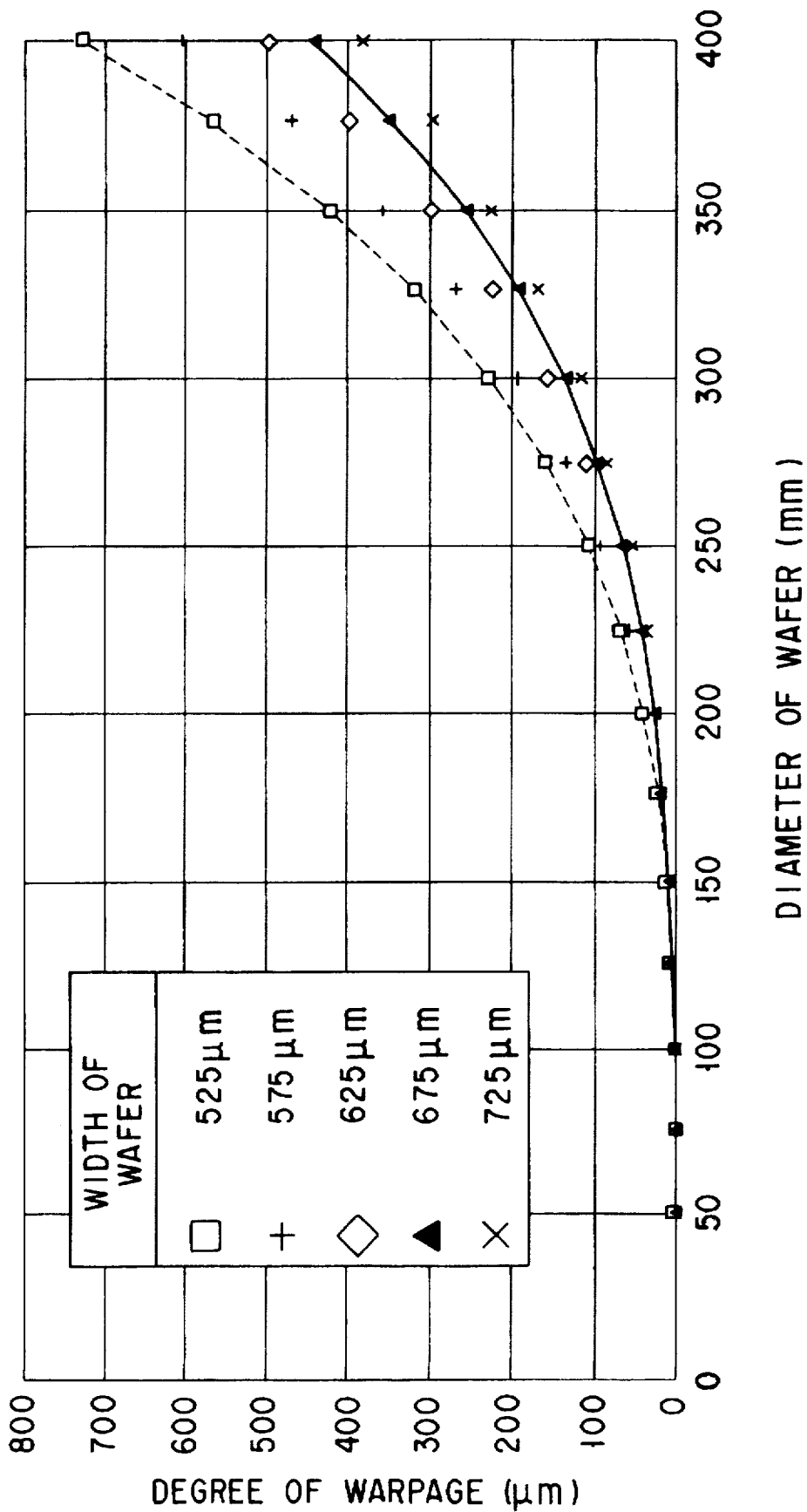
FIG. 5 is a graph showing the relationship between a warpage of the wafer caused by the gravitational load of the wafer and the diameter of the wafer.

FIG. 5 shows the relationship between the warpage of the wafer calculated by this equation and the diameter of the wafer. As a parameter, the thickness of the wafer is changed. As shown in FIG. 5, for example, when the diameter of the wafer is 200 mm, and the thickness of the wafer is 725 mm, the warpage W is about 25 µm. When the diameter of the wafer is 300 mm, and the thickness of the wafer is 725 mm, the warpage W is about 120 µm.

In this manner, assume that the platy member 8 consists of, e.g., Si, that the diameter of the wafer is set to 300 mm, and that the thickness of the wafer is set to 725 µm. In this case, as shown in FIG. 4A, the platy member 8 is formed such that the platy member 8 is warped to be convex upward by a warpage amount a of 120 µm in a state where only the platy member 8 is supported by the boat 2 without a wafer.

This arrangement can be obtained by the following manner. That is, an Si film having a thickness of 725 µm is formed by, e.g., a CVD (Chemical Vapor Deposition) method on a mold having a diameter of 300 mm and a warpage of 240 µm. When the Si platy member 8 is supported by the boat 2 to be convex upward, the warpage of the platy member 8 decreases to 120 µm by the gravitational load of the platy member 8.

When an Si wafer 1 having a diameter of 300 mm and a thickness of, e.g., 725 µm is loaded on the platy member 8 as shown in FIG. 4B, the Si wafer 1 presses the platy member 8 downward by 120 µm due to the gravitational load of the Si wafer 1. For this reason, warpage caused by the gravitational load of the Si wafer 1 and the warpage amount a of the platy member 8 are canceled out, thereby making the Si wafer 1 flat.

In this state, although large stress is generated inside the platy member 8, since the Si wafer 1 on the platy member 8 is almost horizontally held without warpage, stress is rarely generated inside the Si wafer 1. For this reason, when a heat treatment at a high temperature is performed in this state, a crystal defect such as a slip does not occur.

In the above embodiment, although the platy member 8 having a thickness equal to that of the Si wafer 1 consists of the same material as that of the Si wafer 1, the platy member 8 having a thickness different from that of the wafer 1 can also be constituted. For example, when the platy member 8 having a thickness (e.g., 1,450 µm) twice the thickness of the Si wafer 1 is used, the warpage amount a of the platy member 8 when the platy member 8 is supported by the boat 2 is made half that in the above embodiment, i.e., 60 µm. In this manner, when the wafer 1 is loaded on the platy member 8, the Si wafer 1 can be made flat. In this case, since a change amount of the platy member 8 when the wafer 1 is half that in the above embodiment, stress generated in the platy member 8 is made half. For this reason, the possibility of occurrence of a crystal defect in side the platy member 8 can be reduced, and the reliability of the platy member 8 can be improved.

As the material constituting the platy member 8, the material such as Si which is the same as that of the wafer 1 is not necessarily used, another material which has rigidity at a heat treatment temperature and does not contaminate the wafer may be used. For example, since SiC has rigidity at a high temperature and rigidity higher than that of Si, the thickness of the platy member 8 can be decreased. For example, when a platy member having a diameter of 300 mm is constituted by using SiC, in order to cancel a warpage of 120 µm caused by the gravitational load of the Si wafer 1, the platy member requires a thickness of 362 µm. However, this thickness is almost half that required in the first embodiment in which the platy member 8 consists of Si.

As described above, when the thickness of the platy member 8 can be reduced, the heat capacity of the platy member 8 can be reduced. For this reason, the temperature of the wafer 1 subjected to a heat treatment can be raised or lowered at a high speed.

As described above, when the thickness and the warpage amount a of the platy member 8 are properly set according to the characteristics such as an elastic modulus of a material constituting the platy member 8, the wafer 1 can be made flat when the wafer 1 is loaded on the platy member 8.

The thickness of the platy member 8 need not be uniform in the plane of the platy member 8, and the platy member 8 can have a thick portion and a thin portion in the plane. In general, the thick portion of the platy member 8 has a large heat capacity and absorbs a larger amount of heat radiation. For this reason, a temperature distribution generated in the plane of the wafer 1 subjected to a heat treatment is corrected by changing the thickness in the plane of the platy member 8, so that the wafer 1 can be uniformly heated in the plane.

Figure 1A:
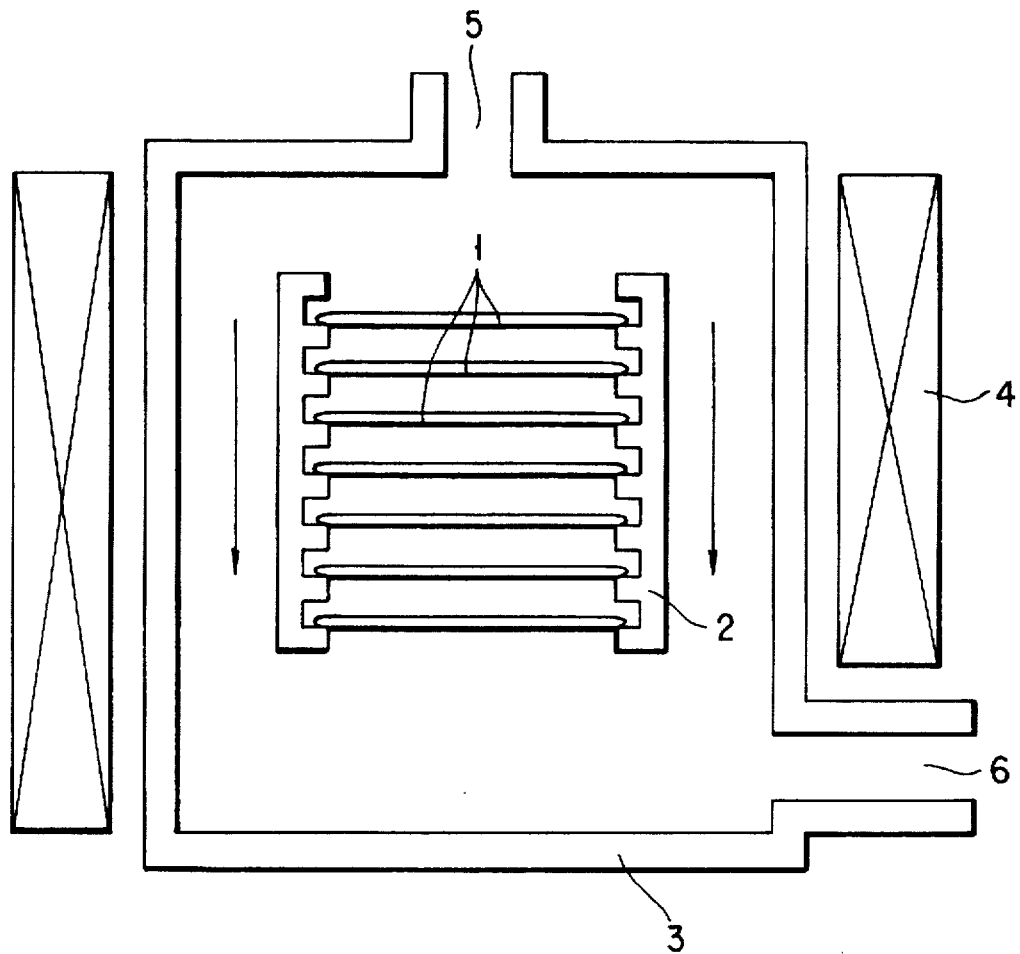
FIGS. 1A and 1B are a sectional view showing the structure of a conventional semiconductor wafer heat treatment apparatus and a upper view of a wafer, respectively.
Figure 1B:
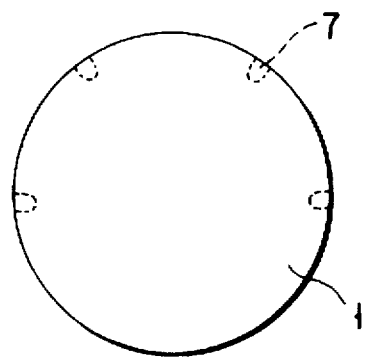
Figure 2:
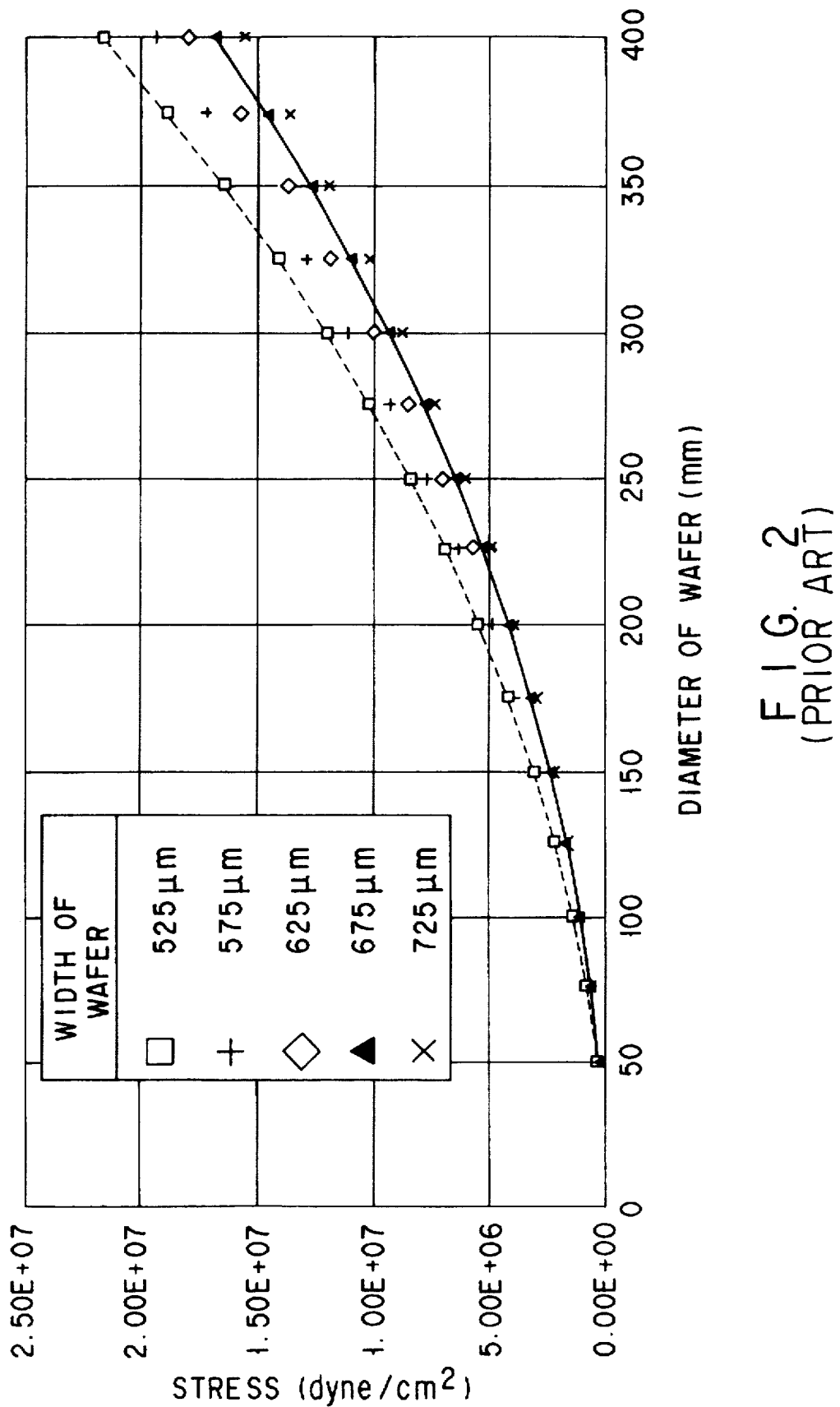
FIG. 2 is a graph showing the relationship between stress generated inside a wafer by the gravitational load of the wafer and the diameter of the wafer.
Figure 3A:
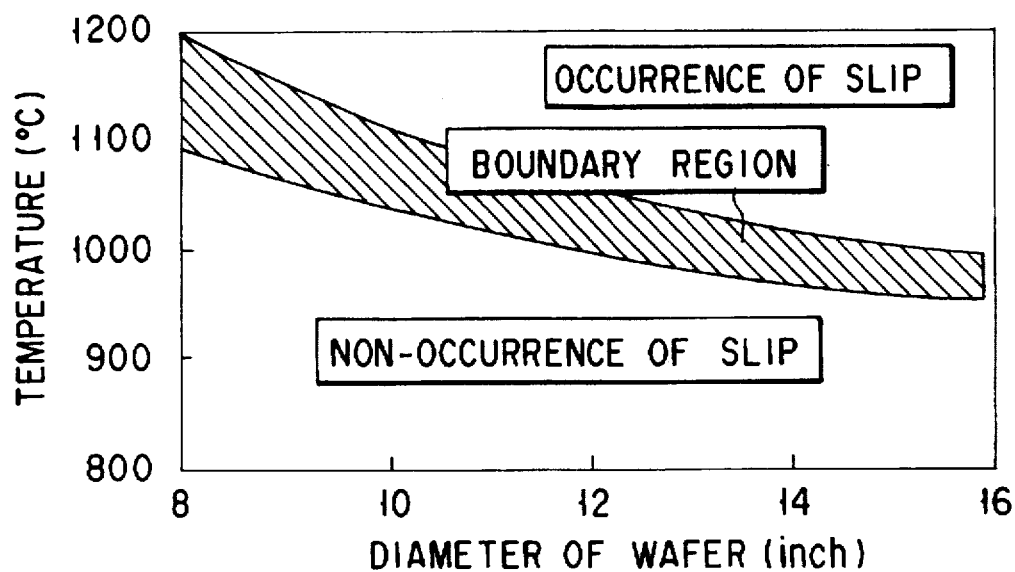
FIGS. 3A and 3B are a graph and a view showing the relationship between a temperature in which a slip occurs in side a wafer and a diameter of the wafer with respect to the occurrence of a slip.
Figure 3B:
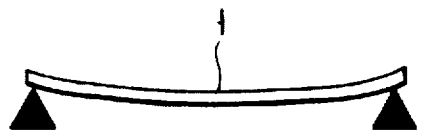

For example, as shown in FIG. 1A, in a semiconductor wafer heat treatment apparatus in which a heater 4 is arranged around the wafer 1, in general, the peripheral portion of the wafer 1 is easily heated. For this reason, the thickness of the peripheral portion of the platy member 8 is increased to increase the heat capacity of the portion, so that the peripheral portion of the wafer 1 can be prevented from being rapidly raised. On the other hand, in the semiconductor wafer heat treatment apparatus in which heaters are arranged opposite to each other on the upper and lower surfaces of the wafer 1, heat is radiated from the peripheral portion of the wafer, the peripheral portion is not easily heated. For this reason, the thickness of the peripheral portion of the platy member 8 is decreased to decrease the heat capacity of the portion, so that the temperature of the peripheral portion of the wafer 1 can be easily raised.

Figure 6A:
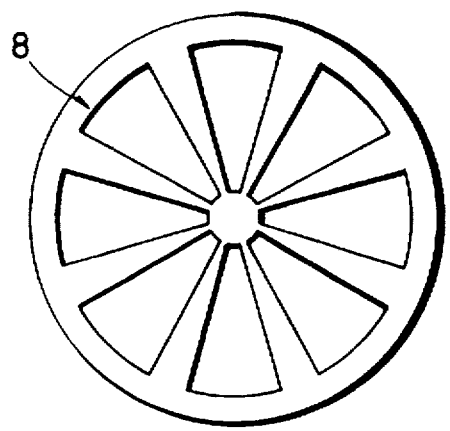
FIGS. 6A and 6B are upper views showing the structures of platy members of a semiconductor wafer heat treatment apparatus according to the second embodiment of the present invention.
Figure 6B:
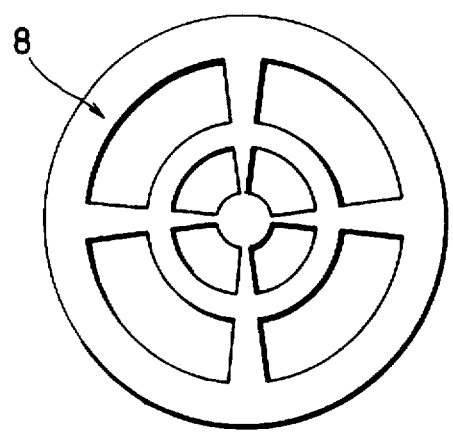

The platy member 8 need not be constituted to entirely cover the lower surface of the wafer 1. FIGS. 6A and 6B are upper views of platy members 8 of the semiconductor wafer heat treatment apparatus according to the second embodiment of the present invention. As shown in FIGS. 6A and 6B, the platy member 8 may be constituted by combining platy portions in a radiation shape (see FIG. 6A) or a concentric shape (see FIG. 6B) to have void portions, or may be constituted by spirally arranging platy portions. In this case, although all the platy portions can be integrally molded, a plurality of platy portions can be respectively formed and then adhered to each other to form the platy member 8.

In this case, the elastic modulus can be changed in the plane by changing the shape, e.g., the width of each platy portion. In this manner, in a state where the wafer 1 is loaded, the elastic modulus can be properly adjusted in the plane of the platy member 8 such that the wafer 1 becomes more flat.

The adjustment of the elastic modulus in the plane can also be performed by changing the thickness in the plane. However, when the platy member 8 is formed by integrally molding, the thickness cannot be easily changed in the plane. In contrast to this, according to this embodiment, the thickness in the plane of the platy member 8 is made uniform by changing the shape of the platy portions, so that the elastic modulus can be changed. In this manner, since each platy portion can be formed by a uniform thickness, the platy member 8 which can perform fine adjustment to make the wafer 1 flat can be easily formed.

When the platy member 8 is formed by dividing a platy portion into a plurality of platy portions, the thickness of each part can be set. For this reason, when the thickness is changed in the plane as described above, the platy member 8 can be easily formed. In this manner, the elastic modulus can be optimized in the plane such that the wafer 1 is kept more flat. In addition, since the thickness of the platy member 8 can be easily changed in the plane, as described above, when the thickness is changed, a temperature distribution in the plane of the wafer 1 can be made more uniform during a heat treatment.

In this case, an amount of heat radiation absorbed by the platy member 8 in a heat treatment can be smaller than that in a case where the lower surface of the wafer 1 is entirely covered. For this reason, radiation energy can be efficiently used, and the temperature of the wafer 1 can be rapidly raised.

When the platy member 8 is constituted by combining a plurality of platy portions, the warpage amount, shape, or the like of the platy member 8 can be easily adjusted.

When the wafer 1 is loaded on the platy member 8, and the wafer 1 is removed from the platy member 8, an opening is present in the platy member 8 in this embodiment. For this reason, for example, the wafer 1 can be easily attached or detached by using a raising pin or the like.

Figure 7A:
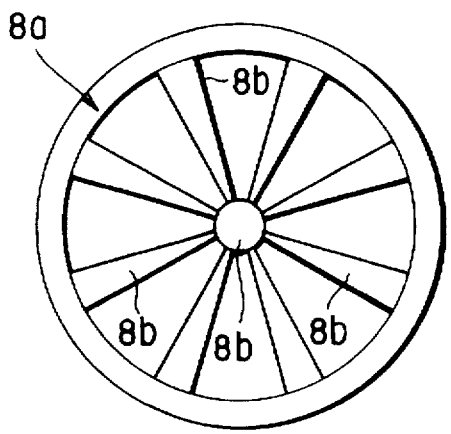
FIGS. 7A to 7D are upper and side views showing the structures of platy members of a semiconductor wafer heat treatment apparatus according to the third embodiment of the present invention.
Figure 7B:
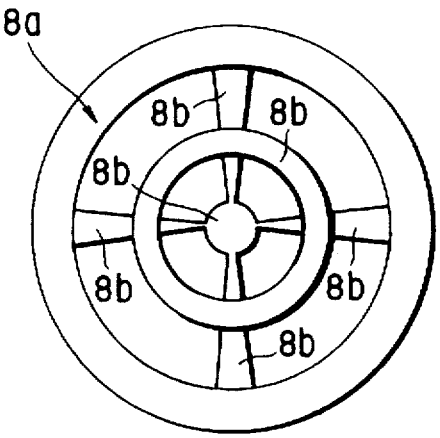
Figure 7C:
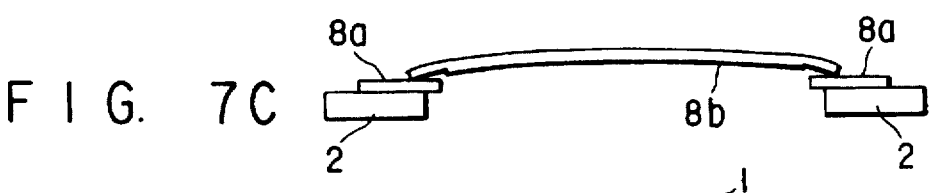
Figure 7D:
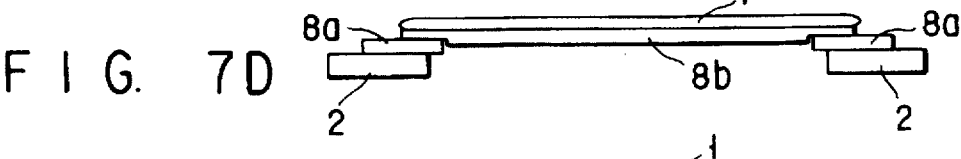

As in the embodiment, when the platy member 8 is constituted by a plurality of platy portions, all the platy portions need not consist of the same material. As the third embodiment, a case where platy portions consisting of different materials are combined to each other to constitute the platy member 8 will be described below with reference to FIGS. 7A to 7D. FIGS. 7A and 7B are upper views showing platy members 8, and FIGS. 7C and 7D are side views showing the platy members 8. FIG. 7C shows a case where only the platy member 8 is supported by the boat 2 without a wafer, and FIG. 7D shows a case where a wafer 1 is loaded on the platy member 8.

The platy member 8 according to this embodiment is constituted by an annular portion 8a consisting of a material such as quartz having a small thermal expansion coefficient and a central portion 8b consisting of a material such as SiC having a thermal expansion coefficient larger than that of the material of the annular portion 8a. In this case, since the annular portion 8a has a small thermal expansion coefficient, the annular portion 8a does not expand at the heat treatment temperature. However, since the central portion 8b has a thermal expansion coefficient larger than that of the annular portion 8a, the central portion 8b expands at, e.g., the heat treatment temperature. However, the outer edge of the central portion 8b is defined by the annular portion 8a, the expanded central portion 8b has a shape warped to be convex as shown in FIG. 7C.

The upper surface side of the platy member 8 consists of a material having a thermal expansion coefficient larger than that of the lower surface side of the platy member 8, so that the expansion of the upper surface side is larger than that of the lower surface side. In this manner, the platy member 8 can be warped to be convex upward.

The material, thickness, shape, and the like of the platy portion constituting the central portion 8b are properly set such that a warpage amount a' at the heat treatment temperature and a warpage caused by the gravitational load of the wafer 1 are canceled out. In this manner, as shown in FIG. 7D, the wafer 1 can be made horizontal when the wafer 1 is loaded on the platy member 8.

As described above, this embodiment has the following characteristic feature. That is, the platy member 8 is constituted by two portions consisting of materials having different thermal expansion coefficients to have a desired warpage amount at a heat treatment temperature. In this manner, the platy member 8 which is warped to be convex upward at a atmospheric temperature need not be formed. At the atmospheric temperature, the platy member 8 having a flat shape can be used. For this reason, the platy member 8 can be formed easier than the platy member 8 having a warped shape at the atmospheric temperature. Handling such as saving of the platy member 8 can be made easy.

The case where the platy member 8 is arranged in the semiconductor wafer heat treatment apparatus is described above. As the fourth embodiment, a method of reducing stress inside a wafer by forming the platy member 8 on the wafer 1 will be described below with reference to FIGS. 8A and 8B.

Figure 8A:
FIGS. 8A and 8B are side views showing the structures of platy members of a semiconductor wafer heat treatment apparatus according to the fourth embodiment of the present invention.
Figure 8B:
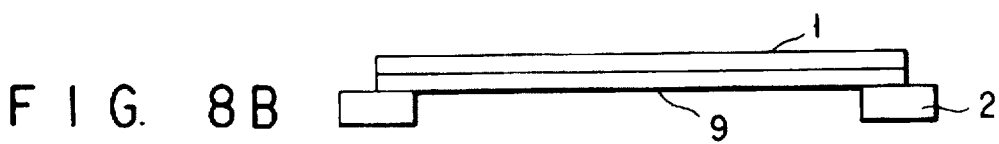

FIGS. 8A and 8B are sectional views showing a state where a nitride film or the like is formed on a wafer 1 as a platy member 9. As shown in FIGS. 8A and 8B, for example, an Si nitride film 9 is formed on one surface of the wafer 1 by using, e.g., a CVD method. At this time, since the Si nitride film 9 is formed on the wafer 1, as shown in FIG. 8A, the wafer 1 is warped such that the surface having the nitride film 9 formed thereon is concave. For this reason, when the wafer 1 with the nitride film 9 is loaded on a boat 2 such that the surface on which the nitride film 9 is formed faces downward, tensile stress caused by the nitride film 9 and stress caused by the gravitational load of the wafer 1 are canceled out, and, as shown in FIG. 8B, the wafer 1 can be set in a horizontal state.

In general, the tensile stress increases in proportion to the thickness of the nitride film 9. By using this relationship, the thickness of the nitride film 9 can be properly set such that stress which cancels stress is generated inside the wafer 1 by the gravitational load of the wafer 1. For example, when the diameter of the wafer 1 is 300 mm, and the thickness is 725 μm, the stress generated inside the wafer 1 by the gravitational load of the wafer 1 is about $9 \times 10^7$ dyn/cm$^2$. In order to cancel this stress, the thickness of the Si nitride film must be about 0.725 μm.

When the stress caused by the gravitational load of the wafer 1 and the stress caused by the nitride film 9 are canceled out, large stress is locally present in the interface between the wafer 1 and the Si nitride film 9. However, stress is rarely present inside the wafer 1. For this reason, the heat treatment is performed in this state, occurrence of a crystal defect can be suppressed.

As shown in FIG. 8A, for example, when the nitride film 9 is formed to warp the wafer 1, tensile stress is generated inside the wafer 1, but a high-temperature state is not set. For this reason, a crystal defect does not occur inside the wafer 1.

As another example of this embodiment, the thickness of the nitride film 9 can be changed in the plane. When the thickness of the nitride film 9 is changed as described above, a stress distribution or a temperature distribution can be adjusted in the plane of the wafer 1. For example, a low-pressure CVD apparatus is used, a temperature is set to 850° C., a pressure is set to 0.5 Torr, SiH$_2$Cl$_2$ and NH$_3$ are fed as source gases at flow rates of 100 sccm and 1,000 sccm, respectively, wafers 1 each having a diameter of 200 mm are arranged at a 3-mm interval, and the Si nitride film 9 is formed. In this case, the thickness of the Si nitride film at the peripheral portion of the wafer 1 is larger than the thickness of the central portion of the wafer 1 by about 30%. In this manner, correction of stress at the central portion of the wafer 1 can be larger than correction of stress at the peripheral portion. When the thickness of the nitride film 9 in the plane is properly changed depending on the distribution of stress generated in the plane by the gravitational load of the wafer 1, stress inside the wafer 1 is more reduced, and occurrence of the crystal defect caused by a heat treatment can be more suppressed.

In the above embodiment, the Si nitride film 9 is formed on the wafer 1. The platy member formed on the wafer 1 is not limited to the Si nitride film in the embodiment, and the platy member can consist of another material which generates tensile stress or compressive stress. In this case, when compressive stress is generated, the surface of the wafer 1 on which the platy member 9 is formed is warped to be convex. For this reason, the wafer 1 is loaded on a boat such that the surface faces upward, and the same effect as that obtained when the tensile stress is generated can be obtained. As a material which generates such compressive stress, for example, SiO$_2$, polysilicon, SiC or the like can be used. Note that SiO$_2$ changes in characteristics depending on the method of producing SiO$_2$. Since SiC has stable characteristics to a high temperature, SiC is desirable used when, especially, a high-temperature heat treatment is performed.

As described above, this embodiment has the following characteristic feature. That is, the platy member 9 is formed on one surface of the wafer 1, and stress generated by the gravitational load of the wafer 1 is canceled by stress generated by the platy member 9. In this manner, stress generated inside the wafer 1 is reduced, and occurrence of a crystal defect caused by a heat treatment can be suppressed.

As has been described above, according to the method and apparatus for semiconductor wafer heat treatment according to the present invention, generation of stress caused by the gravitational load of a wafer can be suppressed. For this reason, the wafer is subjected to a heat treatment, occurrence of a crystal defect in the wafer can be suppressed.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents. For example, although the susceptor as a platy member is supported by the boat (jig) in the above embodiments, it is possible to unifying these members into one member. In this case, the washing and the setting for hot treatment becomes easy.

We claim:

1. A semiconductor wafer heat treatment method, comprising the steps of:

forming, on one surface of a wafer, a susceptor for generating tensile stress between said susceptor and wafer, said susceptor comprising an elastic plate member having a convex upward shape with respect to a direction of gravity;

holding said susceptor such that said tensile stress caused by said susceptor is canceled out by a stress caused by the gravitational load of the wafer at a predetermined heat treatment temperature, thereby flattening the wafer and susceptor; and performing a heat treatment on the wafer.

2. The method according to claim 1, further comprising the step of setting a thickness of said susceptor such that the stress generated in the wafer by the formation of said susceptor is equal to the stress generated by the gravitational load of the wafer.

3. The method according to claim 1, wherein said susceptor prevents deformation caused by the gravitational load of the wafer.

4. The method according to claim 1, wherein said susceptor suppresses stress generated inside the wafer.

5. The method according to claim 1, wherein the wafer has a plurality of portions and said susceptor supports the wafer at the plurality of portions, including a central portion of the wafer.

6. The method according to claim 1, wherein said susceptor has a peripheral portion and a central portion and there is a level height difference between the susceptor's peripheral portion and central portion, said level height difference being determined in accordance with the rigidity, thickness, and diameter of said susceptor.

7. The method according to claim 1, wherein said susceptor comprises a material having a rigidity higher than that of the wafer.

8. The method according to claim 1, wherein the susceptor has a non-uniform thickness distribution.

9. The method according to claim 1, wherein said susceptor has a void portion.

10. The method according to claim 1, wherein said susceptor has a first portion forming an outer peripheral portion of said susceptor, and a second portion arranged inside said first portion, said second portion comprising a material having a thermal expansion larger than that of said first portion.

11. A semiconductor wafer heat treatment method, comprising the steps of:

forming, on one surface of a wafer, a susceptor for generating compressive stress between said susceptor and wafer, said susceptor comprising an elastic plate member having a convex upward shape with respect to a direction of gravity;

holding said susceptor such that said compressive stress caused by the susceptor is canceled out by a stress caused by the gravitational load of said wafer at a predetermined heat treatment temperature, thereby flattening said wafer and susceptor; and performing a heat treatment on the wafer.

12. The method according to claim 11, further comprising the step of setting a thickness of said susceptor such that the stress generated in the wafer by the formation of said susceptor is equal to the stress generated by the gravitational load of the wafer.

13. The method according to claim 11, wherein said susceptor prevents deformation caused by the gravitational load of the wafer.

14. The method according to claim 11, wherein said susceptor suppresses stress generated inside the wafer.

15. The method according to claim 11, wherein the wafer has a plurality of portions and said susceptor contacts the wafer at the plurality of portions, including a central portion of the wafer.

16. The method according to claim 11, wherein said susceptor has a peripheral portion and a central portion and there is a level height difference between the susceptor's peripheral portion and central portion, said level height difference being determined in accordance with the rigidity, thickness, and diameter of said susceptor.

17. The method according to claim 11, wherein said susceptor comprises a material having a rigidity higher than that of the wafer.

18. The method according to claim 11, wherein the susceptor has a non-uniform thickness distribution.

19. The method according to claim 11, wherein said susceptor has a void portion.

20. The method according to claim 11, wherein said susceptor has a first portion forming an outer peripheral portion of said susceptor, and a second portion arranged inside said first portion, said second portion comprising a material having a thermal expansion larger than that of said first portion.

\* \* \* \* \*